(12) United States Patent
An et al.

(10) Patent No.: US 8,547,149 B2
(45) Date of Patent: Oct. 1, 2013

(54) CLOCK AND DATA RECOVERY SYSTEM

(75) Inventors: Fu-Tai An, San Jose, CA (US); Jen-Tai Hsu, Miaoli (TW); Yi-Lin Lee, Hsinchu (TW)

(73) Assignee: Global Unichip Corporation, Hsinchu (TW)

( * ) Notice: Subject to any disclaimer, the term of this patent is extended or adjusted under 35 U.S.C. 154(b) by 406 days.

(21) Appl. No.: 13/064,520

(22) Filed: Mar. 30, 2011

(65) Prior Publication Data

US 2012/0020203 A1 Jan. 26, 2012

(30) Foreign Application Priority Data

Jul. 21, 2010 (TW) .............................. 99123892 A

(51) Int. Cl.
*H03L 7/06* (2006.01)
(52) U.S. Cl.
USPC .......................................... 327/156; 327/147
(58) Field of Classification Search
USPC ................................................. 327/147, 156
See application file for complete search history.

(56) References Cited

U.S. PATENT DOCUMENTS

| | | | | |
|---|---|---|---|---|
| 5,495,512 A * | 2/1996 | Kovacs et al. | ................. | 375/376 |
| 6,526,113 B1 * | 2/2003 | Gutierrez et al. | ............. | 375/376 |
| 7,012,487 B2 * | 3/2006 | Allott | ............................. | 333/214 |
| 7,266,172 B2 * | 9/2007 | Hairapetian et al. | .......... | 375/376 |
| 7,386,085 B2 * | 6/2008 | Momtaz et al. | ................ | 375/376 |
| 7,587,010 B2 * | 9/2009 | Morie et al. | ................... | 375/350 |
| 7,719,365 B2 * | 5/2010 | Sahu et al. | ...................... | 331/17 |
| 8,373,502 B1 * | 2/2013 | Chen et al. | ..................... | 327/551 |
| 2002/0018535 A1 * | 2/2002 | Hairapetian et al. | .......... | 375/376 |
| 2003/0223525 A1 * | 12/2003 | Momtaz et al. | ................ | 375/376 |
| 2004/0170245 A1 * | 9/2004 | Hairapetian et al. | .......... | 375/376 |
| 2005/0212566 A1 * | 9/2005 | Wilson | .......................... | 327/105 |
| 2009/0066446 A1 * | 3/2009 | Sahu et al. | ..................... | 333/172 |
| 2010/0026406 A1 * | 2/2010 | Fujiwara et al. | ............ | 331/36 R |
| 2012/0020203 A1 * | 1/2012 | An et al. | ........................ | 370/216 |
| 2012/0112808 A1 * | 5/2012 | Yotsuji | ........................... | 327/156 |
| 2012/0249197 A1 * | 10/2012 | Rehm | ........................... | 327/156 |

* cited by examiner

*Primary Examiner* — Adam Houston
(74) *Attorney, Agent, or Firm* — Bacon & Thomas, PLLC

(57) ABSTRACT

This invention provides a clock and data recovery system, which comprises a plurality of gm cells, control device, resistor and capacitor. The gm cells respectively have an input end and an output end. The control devices are connected to these output ends. According to a time value, the control device controls a part of the plurality of gm cells to form a first gm cell, and the control device controls another part of the plurality of gm cells to form a second gm cell. The resistor is connected between the first gm cell and the second gm cell. The capacitor is connected to the second gm cell. Wherein, the control device controls the ratio of the first gm cell and the second gm cell in accordance with a time-division multiplexed manner.

10 Claims, 6 Drawing Sheets

CLOCK AND DATA RECOVERY SYSTEM

BACKGROUND OF THE INVENTION

1. Field of the Invention

This invention relates to a clock and data recovery system, particularly to a clock and data recovery system using the time-division multiplexed manner to control the ratio of the two gm values, and using the chopper modulation technique to mitigate the input-referred offset of the gm cells.

2. Description of the Prior Art

The clock and data recovery circuit (abbreviated as CDR) is applied to the receiving interface of serial transmission, which is often completed by the digital circuit under lower frequency. The most common circuit is the digital phase locking loop (DPLL). However, in some high-speed applications, such as the optical fiber communication system, due to the clock frequency of transmitted data is quite higher, thus it is usually completed by the analog circuit. Most of existing products utilize BJT or BiCMOS process, the operation frequency is higher, the resistant ability is stronger for noise, and the performance is better. However, the shortcomings are high process cost, difficult integration, and higher consumption of current. In recent years, the CMOS process technology is progressed constantly, due to the CDR circuit often has to be integrated with other circuits, thus the CMOS with the advantages of low power consumption, low price, and easy integration can be considered as quite suitable. Following the popularization of multimedia application, the demand for the transmission of communication system or other digital information has increased day by day in recent years, so that the clock and data recovery circuit has quite big application space and plays more important role.

The clock and data recovery circuit usually needs very small jitter peaking to obtain better jitter conversion expression. However, the conventional clock and data recovery circuit uses the loop capacitor in the circuit, which occupies larger circuit area, particularly upon using a passive capacitor to reduce the noise.

FIG. 1 is a graph illustrating a conventional clock and data recovery circuit with the charge pump. The conventional clock and data recovery circuit uses a charge pump clock and data recovery circuit widely. Charge pump clock and data recovery circuit 100 includes a phase detector 102, a charge pump 104, a loop filter 106 and a voltage control oscillator 108. The phase detector 102 receives a data signal DATA and a local clock CLK, then compares the phase difference between data signal DATA and local clock CLK, in order to generate two control signals UP, DN. The phase detector 102 is a Bang-Bang Phase Detector or a Binary Phase Detector. The control signals UP, DN are used to control a set of switch 1042 and to turn on a set of current source 1044, so that the current I from the current source 1044 charges the loop filter 106 to generate output voltage V. Output voltage V controls voltage control the oscillator 108 to adjust the phase of local clock CLK, so that the local clock CLK can maintain a constant phase difference with respect to the local clock CLK. Loop filter 106 includes a resistor 1062 and a capacitor 1064, which is used to filter the current I generated by the charge pump 104, wherein the resistor 1062 is connected to the capacitor 1064 in serial, and another terminal of the capacitor 1064 is connected to a ground terminal. In addition, the loop filter 106 further includes a capacitor 1066, which is used to inhibit high frequency jitter, and another terminal of the capacitor 1066 is also connected to a ground terminal. Normally, the tolerance of capacitor 1066 is much smaller than that of the capacitor 1064, so the capacitor 1066 is neglected herein. In order to get a smaller jitter peaking, a big loop capacitor is installed as the capacitor 1064. It may remove the zero of loop transfer function to obtain a very low frequency. However, the shortcoming of the big loop capacitor is that it occupies larger area. Furthermore, when the data rate of the clock and data recovery circuit is very high, the design bottleneck will be encountered.

FIG. 2 is a graph illustrating a conventional gm clock and data recovery circuit. In order to solve the bottleneck of high-speed data rate, gm cell 204 is used to substitute the charge pump. As shown in FIG. 2, a gm clock and data recovery circuit 200 includes a gm cell 204, a loop filter 206 and a voltage control oscillator 208. The gm cell 204 has input voltage Vos, leakage current ileak and a gm unit 2042. The phase detector 202 receives a data signal DATA and a local clock CLK, then compares the phase difference between data signal DATA and local clock CLK, in order to generate two control signals. The loop filter 206 includes a resistor 2062 and a capacitor 2064, which is used to filter current I generated by the charge pump 204, wherein the resistor 2062 is connected to the capacitor 2064 in serial, and another terminal of the capacitor 2064 is connected to a ground terminal. The gm cell 204 is connected to the phase detector 202. Similar to the charge pump clock and data recovery circuit, in order to obtain a smaller jitter peaking, a big loop capacitor is installed as the capacitor 2064. It may remove the zero of loop transfer function to obtain a very low frequency. The hardware occupies larger area, and the cost is higher. However, compared to the charge pump clock and data recovery circuit, the gm clock and data recovery circuit does not need high-speed switching. Thus, its performance is satisfactory at high speed (several Gb/sec and greater than several Gb/sec). However, the gm clock and data recovery circuit has to solve the problems, such as leakage current and bias due to mismatch, larger area occupancy of gm unit, and large power loss etc.

Therefore, how to research and develop an innovative clock and data recovery circuit, so as to save the circuit area of gm-LPF will be a main disclosure of this invention.

SUMMARY OF THE INVENTION

The main purpose of the invention is to provide a dual gm structure to reduce the loop capacitance. The dual gm in the loop is controlled by the time-division multiplexed manner, thus the connection of multiple capacitors can be achieved precisely.

The invention also uses the chopper modulation technique to mitigate the input-referred offset of the gm cells, in order to calibrate the current mismatch of the gm cells in the background. The phase locking error and pattern jitter are hence minimized and the locking range is ensured.

In order to achieve the above-mentioned purpose, the invention provides a clock and data recovery system, comprising: a plurality of gm cells, a control device, a plurality of gm cells, a resistor and a capacitor. Every gm cells respectively have an input end and an output end. The control devices are connected to a plurality of output ends. According to a time value, the control device controls a part of the plurality of gm cells to form a first gm cell, and the control device controls another part of the plurality of gm cells to form a second gm cell. The resistor is connected between the first gm cell and the second gm cell. The capacitor is connected to the second gm cell. Wherein, the control device controls the ratio of the first gm cell and the second gm cell in accordance with a time-division multiplexed manner.

Therefore, the invention provides a clock and data recovery system, which can significantly reduce the area occupancy of the gm-LPF in the system.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

In order to let the above-mentioned purposes, characteristics and advantage of the invention obviously easier to be understood, some preferred embodiments and Figures will be described as follows in detail.

Figure 1:
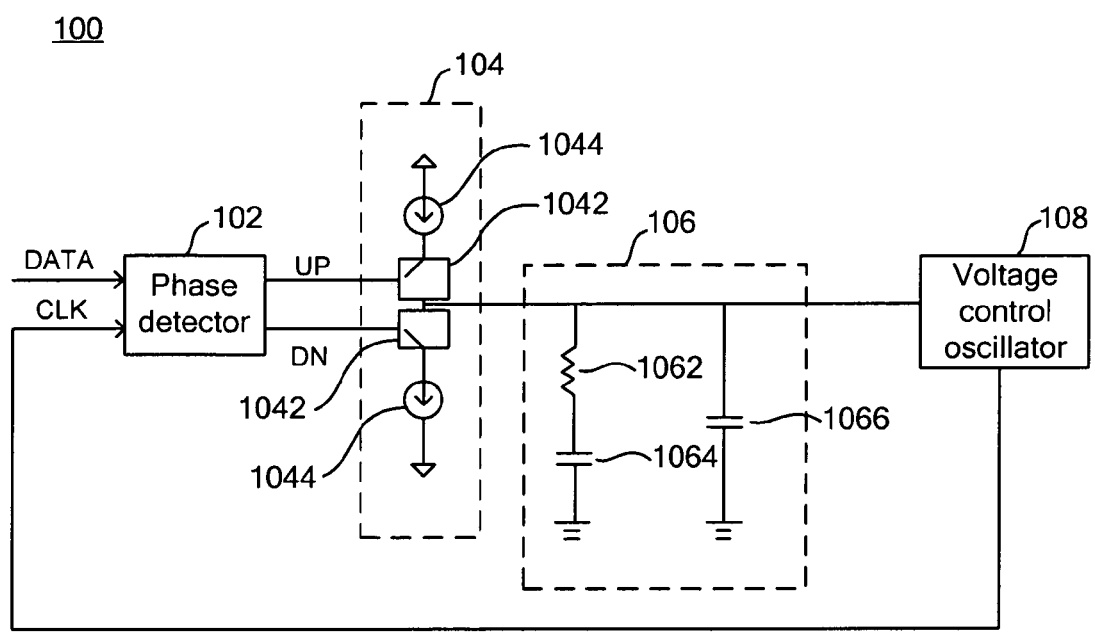
FIG. 1 is a graph illustrating a conventional clock and data recovery circuit with the charge pump.
Figure 2:
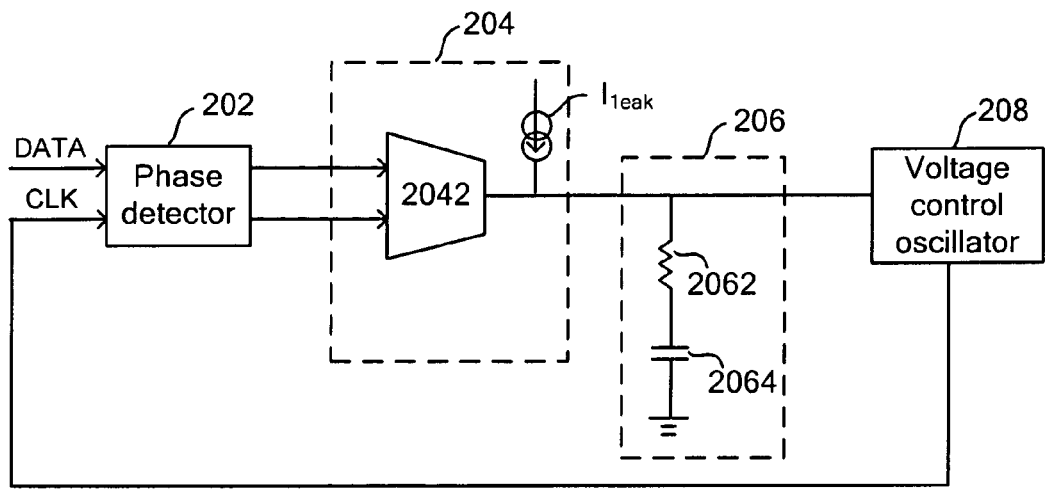
FIG. 2 is a graph illustrating a conventional gm clock and data recovery circuit.
Figure 3A:
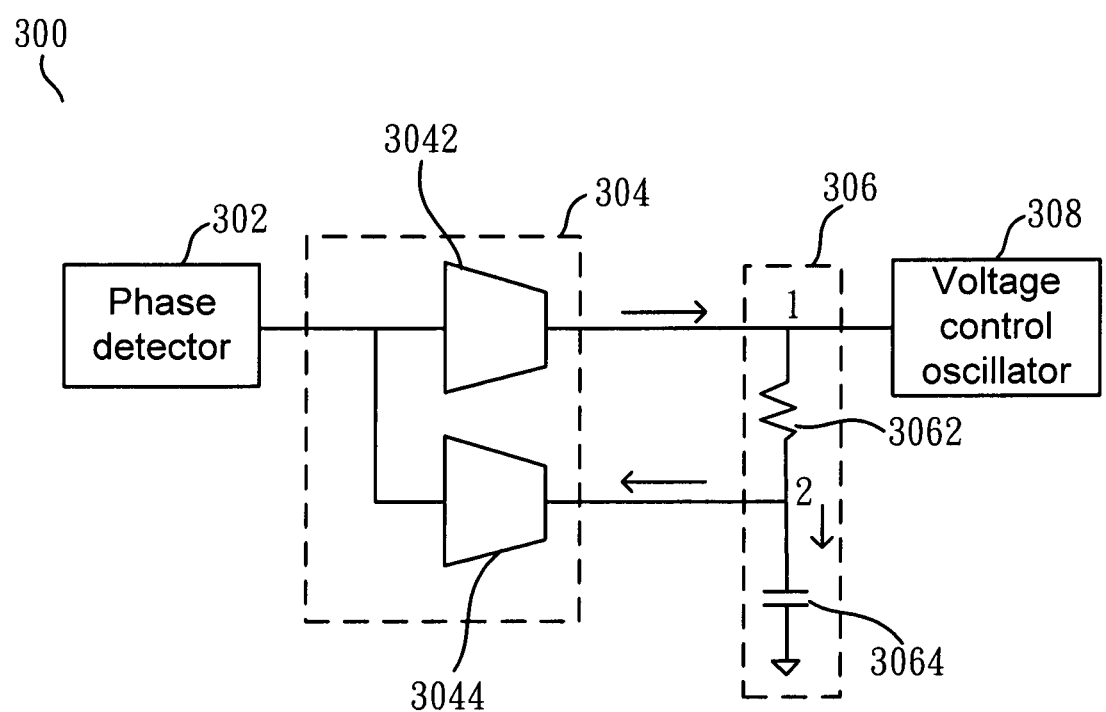
FIG. 3A is a graph illustrating a dual gm clock and data recovery system.

FIG. 3A is a graph illustrating a dual gm clock and data recovery system. As shown in the FIG. 3A, a dual gm clock and data recovery system 300 comprises a phase detector 302, a gm cell 304, a loop filter 306 and a voltage control oscillator 308. The gm cell 304 comprises a first gm cell 3042 and a second gm cell 3044. The loop filter 306 comprises a resistor 3062 and a capacitor 3064. The resistor 3062 is connected between the first gm cell 3042 and the second gm cell 3044, which is connected to a first node 1 of the loop filter 306 with the first gm cell 3042 and the voltage control oscillator 308. The capacitor 3064 is connected to the second gm cell 3044 at a second node 2 of the loop filter 306. This dual gm structure is similar to that been used in dual-path PLL designs. The majority of current flowing out the first gm cell 3042 enters the second gm cell 3044. In other words, only a fraction of current is dumped onto the capacitor 3064. Therefore, the effective capacitance is multiplied. However, the random mismatch of the first gm cell 3042 and the second gm cell 3044 introduces the uncertainty on the capacitance multiplication. Therefore, it is necessary to use a time-division multiplexing technique to control the gm connection way of the first path and the second path, in order to reach stable high capacitance.

Figure 3B:
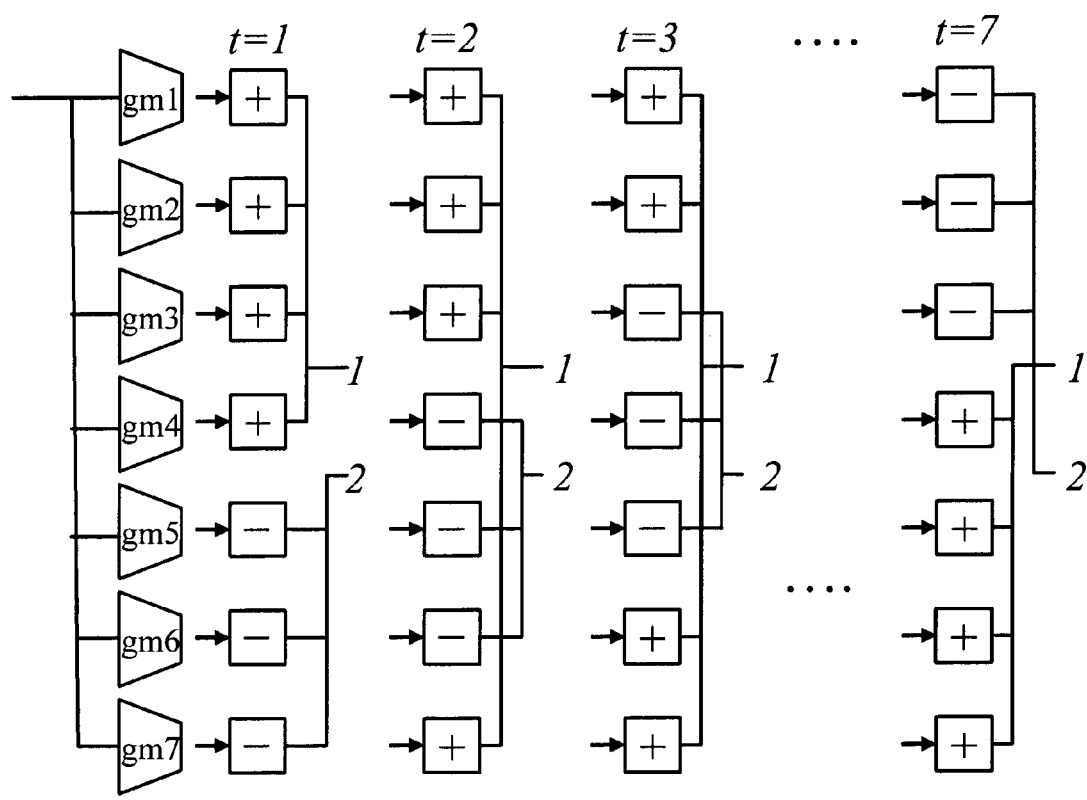
FIG. 3B is a graph illustrating a time-division multiplexing technique for controlling the first path and the second path.

FIG. 3B is a graph illustrating a time-division multiplexing technique for controlling the first path and the second path. The time-division multiplexing technique can connect different gm cell to form a time-division multiplexed gm array in accordance with different time. As shown in the FIG. 3B, at different time t, the first node 1 and the second node 2 are respectively connected to different gm cells. In the embodiment, the gm array is composed of seven gm cells. There are respectively a first gm cell gm1, a second gm cell gm2, a third gm cell gm3, a forth gm cell gm4, a fifth gm cell gm5, a sixth gm cell gm6 and a seventh gm cell gm7, in order to form the first gm cell 3042 and the second gm cell 3044. It is necessary to describe that the polarity of the first gm cell 3042 is different with the second gm cell 3044

For example, when t=1, the first node 1 is connected to the first gm cell gm1, the second gm cell gm2, the third gm cell gm3 and the forth gm cell gm4 to form the first gm cell 3042; while the second node 2 is connected to the fifth gm cell gm5, the sixth gm cell gm6 and the seventh gm cell gm7 to form the second gm cell 3044. In the embodiment, the majority of current flowing out the first gm cell 3042 enters to the second gm cell 3044. In other words, only a fraction of current is dumped onto the capacitor 3064. Therefore, the effective capacitance is multiplied by 4 times. Each cell connects to the first node 1 with positive polarity, while connects to the second node 2 with negative polarity.

In General, the gm cell connecting to the first node 1 has a positive polarity period which is number of the first gm cell/(number of the first gm cell+number of the second gm cell), and the gm cell connecting to the second node 2 has a negative polarity a period which is number of the second gm cell/(number of the first gm cell+number of the second gm cell). At the static condition, the ratio of first gm cell 3042 to second gm cell 3044 is (number of the first gm cell/number of the second gm cell). If (number of the first gm cell−number of the second gm cell)=1, the equivalent value of capacitor 3064 equals to the number of first gm cell, and is free from random mismatch of individual gm cell.

In the embodiment, each cell connects to the first node 1 with positive polarity for 4/7 period, and each cell connects to the second node 2 with negative polarity for 3/7 period. At the static condition, the ratio of the first gm cell 3042 to the second gm cell 3044 is 4/3. As shown in the FIG. 3B, when the time t is different, the first node 1 and the second node 2 respectively connect to different gm cells.

The invention also uses the chopper modulation technique to solve random mismatch of individual gm cell, in order to mitigate the input-referred offset of the gm cells. Not only the direct current offset can be modulated into a modulation frequency, but also the switching noise can be filtered out by the loop filter. In addition, the current mismatch of individual gm cell can be mitigated by the background calibration technique.

Figure 4:
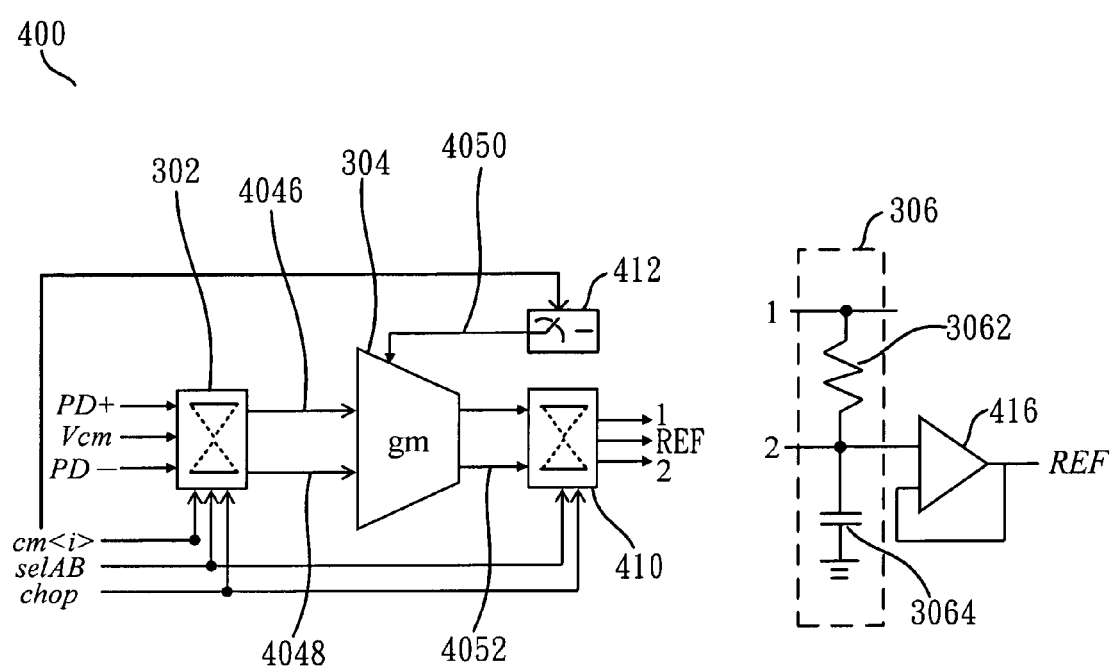
FIG. 4 is a graph illustrating another embodiment of a clock and data recovery system.

Please refer to FIG. 4, a graph illustrating another embodiment of a clock and data recovery system. As shown in the FIG. 4, the clock and data recovery system 400 comprises a plurality of gm cells 304, a control device 410, a resistor 3062 and a capacitor 3064. The resistor 3062 and the capacitor 3064 form the loop filter 306.

Still referring to FIG. 4, in the embodiment, the plurality of gm cells 304 are similar to those of FIG. 3A and FIG. 3B. In the embodiment, the first gm cell 3042 and the second gm cell 3044 are included in a plurality of gm cells 304, and the control device 410 is used to respectively control gm cells connected to the first node 1 and the second node 2.

Still referring to FIG. 3A, FIG. 3B, and FIG. 4, the plurality of gm cells 304 respectively have input ends 4046, 4048 and output ends 4050, 4052. The control device 410 is connected to output ends 4050, 4052. According to a time value t, the control device 410 controls a part of these gm cells 304 to form the first gm cell 3042, and the control device 410 controls another part of the plurality of gm cells to form the second gm cell 3044. The resistor 3062 is connected between the first gm cell 3042 and the second gm cell 3044. The capacitor 3064 is connected to the second gm cell 3044. Wherein, the control device 410 controls the ratio of the first gm cell 3042 and the second gm cell 3044 in accordance with a time-division multiplexed manner.

Still referring to FIG. 3A, FIG. 3B, and FIG. 4, the input ends 4046, 4048 of the plurality of gm cells 304 are connected to the phase detector 302. Positive signal PD+, negative signal PD−, third signal cm<i> and detector input voltage Vcm are inputted into the phase detector 302. The i in the third signal cm<i> represents the gm cell i. The clock and data recovery system 400 further includes a first signal selAB and a second signal chop. The first signal selAB and the second signal chop are connected to the control device 302 and the phase detector 410. The clock and data recovery system 400 further includes a power source 412. The power source 412 supplies the power to the plurality of gm cells 304 and the third signal cm<i> is inputted to the power source 412. In the embodiment, the second signal is a chopper signal. The ratio of the first gm cell 3042 to the second gm cell 3044 is 4 to 3. The control device 410 is connected to the first node 1, the second node 2 and the reference node REF. The second node 2 is connected to the input of an amplifier 416. The output of the amplifier 416 is connected to the reference node REF.

Figure 5:
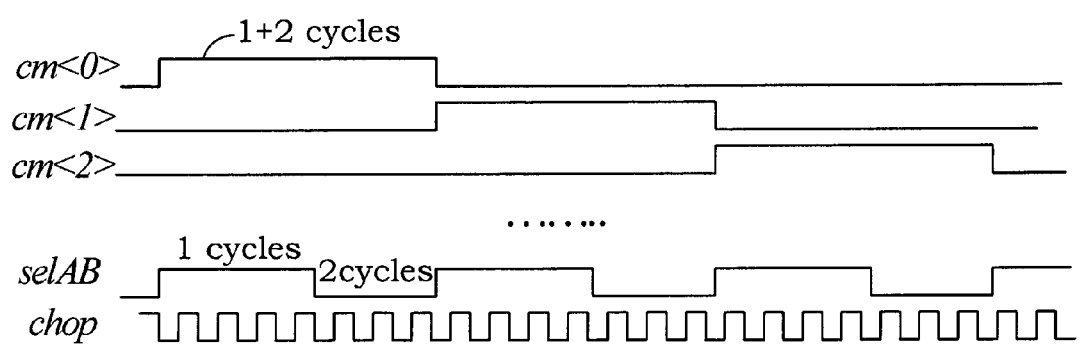
FIG. 5 is a graph illustrating the timing diagram of the control signals for the clock and data recovery system shown in FIG. 4.

As FIG. 4 is a graph illustrating clock and data recovery system 400 with the switching structure, and FIG. 5 is a graph illustrating the timing diagram of the control signals for the clock and data recovery system shown in FIG. 4. Therefore, as the timing diagram of the control signals shown in FIG. 5, if cm<i> is asserted for gm cell i, its input is set to a common-mode, and its outputs are transformed to a common-mode sensing node. The bias information is stored in the gm cell, could be on a capacitor or through other means, to balance the current. In addition, since the outputs of the gm cell 304 are nominally high impedance, thus the reference node REF is just to provide a proper voltage for the gm cell 304. When selAB signal is asserted, it means that the gm cell 304 is serving as in the first gm cell 3042. Therefore, its outputs are connecting to the first node 1 and the reference node REF. On the other hand, if selAB signal is de-asserted, the outputs of the gm cell are connecting to the second node 2 and the reference node REF.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A clock and data recovery system, comprising:
    a plurality of gm cells respectively having an input end and an output end;
    a control device, controlling a part of the plurality of gm cells to form a first gm cell, and the control device controlling another part of the plurality of gm cells to form a second gm cell;
    a resistor, connecting between the first gm cell and the second gm cell; and
    a capacitor, connecting to the second gm cell; wherein the control device controls the ratio of the first gm cell and the second gm cell in accordance with a time-division multiplexed manner.

2. The system according to claim 1, wherein the number of gm cells comprises 7.

3. The system according to claim 2, wherein the ratio of the first gm cell to the second gm cell is 4 to 3.

4. The system according to claim 1, wherein the input end is connected to a phase detector.

5. The system according to claim 4, wherein the clock and data recovery system further comprises a first signal and a second signal, and the first signal and the second signal being connected to the control device and the phase detector.

6. The system according to claim 5, wherein the phase detector comprises a positive signal, a negative signal, a detector input voltage and a third signal.

7. The system according to claim 6, wherein the clock and data recovery system further comprises a power source, and the third signal is inputted to the power source.

8. The system according to claim 5, wherein the second signal comprises a chopper signal.

9. The system according to claim 1, wherein the polarity of output end connected by the first gm cell comprises positive.

10. The system according to claim 1, wherein the polarity of output end connected by the second gm cell comprises negative.

* * * * *